(12) United States Patent
Liu et al.

(10) Patent No.: US 11,495,898 B2
(45) Date of Patent: Nov. 8, 2022

(54) CONNECTOR PADDLE CARD WITH IMPROVED WIRING CONNECTION GEOMETRY

(71) Applicant: Credo Technology Group Limited, Grand Cayman (KY)

(72) Inventors: Xike Liu, Shanghai (CN); Zhining Li, Shanghai (CN); Xiangxiang Ye, Shanghai (CN); Gaige Mei, Shanghai (CN)

(73) Assignee: Credo Technology Group Limited, Grand Cayman (KY)

( * ) Notice: Subject to any disclaimer, the term of this patent is extended or adjusted under 35 U.S.C. 154(b) by 23 days.

(21) Appl. No.: 17/146,350

(22) Filed: Jan. 11, 2021

(65) Prior Publication Data
US 2021/0280996 A1     Sep. 9, 2021

(30) Foreign Application Priority Data
Mar. 5, 2020  (CN) .......................... 202010149136.4

(51) Int. Cl.
| | |
|---|---|
| *H01R 3/00* | (2006.01) |
| *H01R 12/53* | (2011.01) |
| *H05K 1/11* | (2006.01) |
| *H01R 43/02* | (2006.01) |

(52) U.S. Cl.
CPC ............. *H01R 12/53* (2013.01); *H01R 43/02* (2013.01); *H05K 1/117* (2013.01); *H05K 2201/09163* (2013.01); *H05K 2201/09409* (2013.01)

(58) Field of Classification Search
CPC ....... H01R 12/79; H01R 12/78; H01R 12/592
See application file for complete search history.

(56) References Cited

U.S. PATENT DOCUMENTS

| | | | | |
|---|---|---|---|---|
| 3,490,096 A | * | 1/1970 | Johnson .............. | E04F 13/0862 425/170 |
| 5,122,064 A | * | 6/1992 | Zarreii ................... | H01R 12/58 439/79 |
| 5,629,839 A | * | 5/1997 | Woychik ............... | H05K 3/366 439/55 |

(Continued)

OTHER PUBLICATIONS

Maeda, K., Norimatsu, T., Kogo, K., Kohmu, N., Nishimura, K., and Fukasaku, I., "An Active Copper-Cable Supporting 56-Gbit/s PAM4 and 28-Gbit/s NRZ with Continuous Time Linear Equalizer IC for to-Meters Reach Interconnection," 2018 IEEE Symposium on VLSI Circuits, 2018, pp. 49-50, doi: 10.1109/VLSIC.2018.8502352.

*Primary Examiner* — Phuong Chi Thi Nguyen
(74) *Attorney, Agent, or Firm* — Ramey LLP; Daniel J. Krueger

(57) ABSTRACT

Connector paddle cards are provided with an improved wiring connection geometry that reduces impedance mismatch. One illustrative embodiment is a printed circuit board having, on at least one surface: edge connector traces arranged along a first edge for contacting electrical conductors in a socket connector; an outer set of electrodes arranged parallel to a second edge for attaching exposed ends of sheathed wires in a cable ("outer wires"); and an inner set of electrodes arranged parallel to the second edge for attaching exposed ends of sheathed wires in a cable ("inner wires"), with the electrodes in the inner set being staggered relative to the electrodes in the outer set.

20 Claims, 4 Drawing Sheets

(56) References Cited

U.S. PATENT DOCUMENTS

| | | | | |
|---|---|---|---|---|
| 5,838,579 A | * | 11/1998 | Olson | G06F 30/33 |
| | | | | 703/2 |
| 6,076,726 A | * | 6/2000 | Hoffmeyer | H05K 3/3463 |
| | | | | 228/56.3 |
| 6,143,108 A | * | 11/2000 | Risen, Jr | C09J 183/06 |
| | | | | 385/134 |
| 6,496,384 B1 | * | 12/2002 | Morales | H05K 3/366 |
| | | | | 29/830 |
| 7,655,869 B2 | * | 2/2010 | Kawaguchi | H05K 3/4691 |
| | | | | 174/254 |
| 7,881,064 B2 | | 2/2011 | Cole et al. | |
| 9,049,787 B2 | | 6/2015 | Bugg | |
| 9,549,469 B2 | * | 1/2017 | Beaman | H05K 3/403 |
| 9,705,273 B2 | | 7/2017 | Guetig et al. | |
| 9,748,723 B2 | | 8/2017 | Sussman | |
| 9,751,144 B2 | | 9/2017 | Wu et al. | |
| 10,165,671 B2 | | 12/2018 | Bugg | |
| 10,193,268 B1 | | 1/2019 | Chow et al. | |
| 2009/0197459 A1 | | 8/2009 | Yu et al. | |
| 2017/0271834 A1 | | 9/2017 | Guetig et al. | |

\* cited by examiner

CONNECTOR PADDLE CARD WITH IMPROVED WIRING CONNECTION GEOMETRY

BACKGROUND

The Institute of Electrical and Electronics Engineers (IEEE) Standards Association publishes an IEEE Standard for Ethernet, IEEE Std 802.3-2015, which will be familiar to those of ordinary skill in the art to which this application pertains. This Ethernet standard provides a common media access control specification for local area network (LAN) operations at selected speeds from 1 Mb/s to 100 Gb/s over coaxial cable, twinaxial cable, twisted wire pair cable, fiber optic cable, and electrical backplanes, with various channel signal constellations. Various standard cable connectors and connection ports are provided including, e.g., QSFP-DD ("quad small form-factor pluggable double density") connectors, which are designed to house small printed circuit boards with integrated transceiver electronics. In this context, the printed circuit boards are often called "paddle cards".

"Paddle card" is a jargon phrase. "Card" suggests that the board is smaller board (e.g., a daughter card) intended to plug into a larger board (e.g., a motherboard), usually with an edge connector that fits into a corresponding slot on the larger board. A "paddle card" is a specialized type of daughter card that functions as an adapter, typically having a minimal number of electronic components that couple signals from the edge connector to external system components. More specifically, the paddle card may receive and re-drive signals passing between the motherboard and the external component, often providing protocol translation as part of the process.

When used as part of a cable connector, the paddle card interfaces with the optical fibers, electrical conductors, or other signal communication channels. For example, the signal wires in a cable may be soldered to terminals along one edge of the card. However, existing cards employ signal wire connections having undesirably large impedance mismatches at the baud rates being contemplated for the latest versions of the IEEE standard (50 GBaud and above).

SUMMARY

Accordingly, there are disclosed herein connector paddle cards having improved wiring connection geometry that reduces impedance mismatch. Also disclosed are cables using such paddle cards and methods for manufacturing such paddle cards. One illustrative embodiment is a printed circuit board having, on at least one surface: edge connector traces arranged along a first edge for contacting electrical conductors in a socket connector; an outer set of electrodes arranged parallel to a second edge for attaching exposed ends of sheathed wires in a cable ("outer wires"); and an inner set of electrodes arranged parallel to the second edge for attaching exposed ends of sheathed wires in a cable ("inner wires"), with the electrodes in the inner set being staggered relative to the electrodes in the outer set.

An illustrative cable embodiment includes sheathed wires extending between a first connector and a second connector, with each of the first and second connectors including a printed circuit board as described above.

An illustrative cable manufacturing method includes: providing first and second printed circuit boards each having: edge connector traces arranged along a first edge for contacting electrical conductors when the printed circuit board is inserted in a matching socket; an outer set of electrodes arranged parallel to a second edge for attaching unsheathed ends of certain sheathed wires in a cable; and an inner set of electrodes arranged parallel to the second edge for attaching unsheathed ends of other sheathed wires in the cable, with the electrodes in the inner set being staggered relative to the electrodes in the outer set. The method further includes: soldering unsheathed ends of the sheathed wires to the electrodes in the inner and outer set; and packaging the first and second printed circuit boards into connectors adapted to fit the matching socket.

Each of the foregoing embodiments may be implemented individually or conjointly, and may be implemented with one or more of the following features in any suitable combination: 1. the electrodes in each of the inner and outer sets being spaced to enable the inner wires to pass between the outer wires while maintaining contact with the at least one surface. 2. the outer wires each have a sheath with a given thickness adjacent to the exposed end. 3. the printed circuit board includes one or more recesses in the at least one surface along each outer wire sheath's path between the second edge and the outer set of electrodes. 4. the one or more recesses each accommodates sheathes of multiple outer wires. 5. each outer wire has a corresponding one of the one or more recesses. 6. each of the one or more recesses is deep enough to accommodate the given thickness of the sheath, enabling each of the exposed ends of the outer wires to contact the electrodes in the outer set while remaining parallel to the at least one surface. 7. a second surface having: a second outer set of electrodes arranged parallel to the second edge for attaching exposed ends of sheathed outer wires; and one or more recesses in the second surface extending along a path of each sheathed outer wire's sheath between the second edge and the second outer set of electrodes. 8. an integrated circuit that recovers and remodulates signals passing between the edge connector traces and the electrodes of the inner and outer sets.

DETAILED DESCRIPTION

Figure 1:
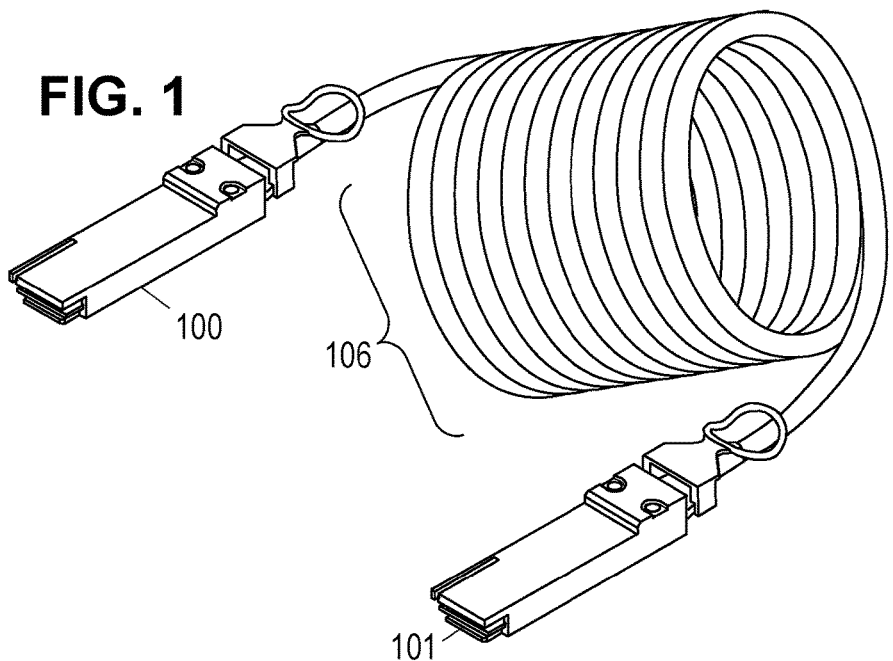
FIG. 1 is a perspective view of an illustrative active Ethernet cable (AEC).

While specific embodiments are given in the drawings and the following description, keep in mind that they do not limit the disclosure. On the contrary, they provide the foundation for one of ordinary skill to discern the alternative forms, equivalents, and modifications that are encompassed in the scope of the appended claims.

FIG. 1 is a perspective view of an illustrative cable that may be used to provide a high-bandwidth communications link between devices in a routing network such as that used for data centers, server farms, and interconnection exchanges. The routing network may be part of, or may include, for example, the Internet, a wide area network, or a local area network. The linked devices may be computers, switches, routers, and the like. The cable includes a first connector 100 and a second connector 101 that are connected via electrical conductors packaged together in a 106 cord. The electrical conductors may be individually and (optionally) collectively shielded, having grounded conductive sheaths like coaxial or twinaxial cables to reduce signal crosstalk. The electrical conductors are preferably driven with single-ended or differential signals at 50 GBaud or more. Each connector 100, 101 includes a powered transceiver that performs clock and data recovery (CDR) and re-modulation of data streams, hereafter called a data recovery and re-modulation (DRR) device.

Figure 2:
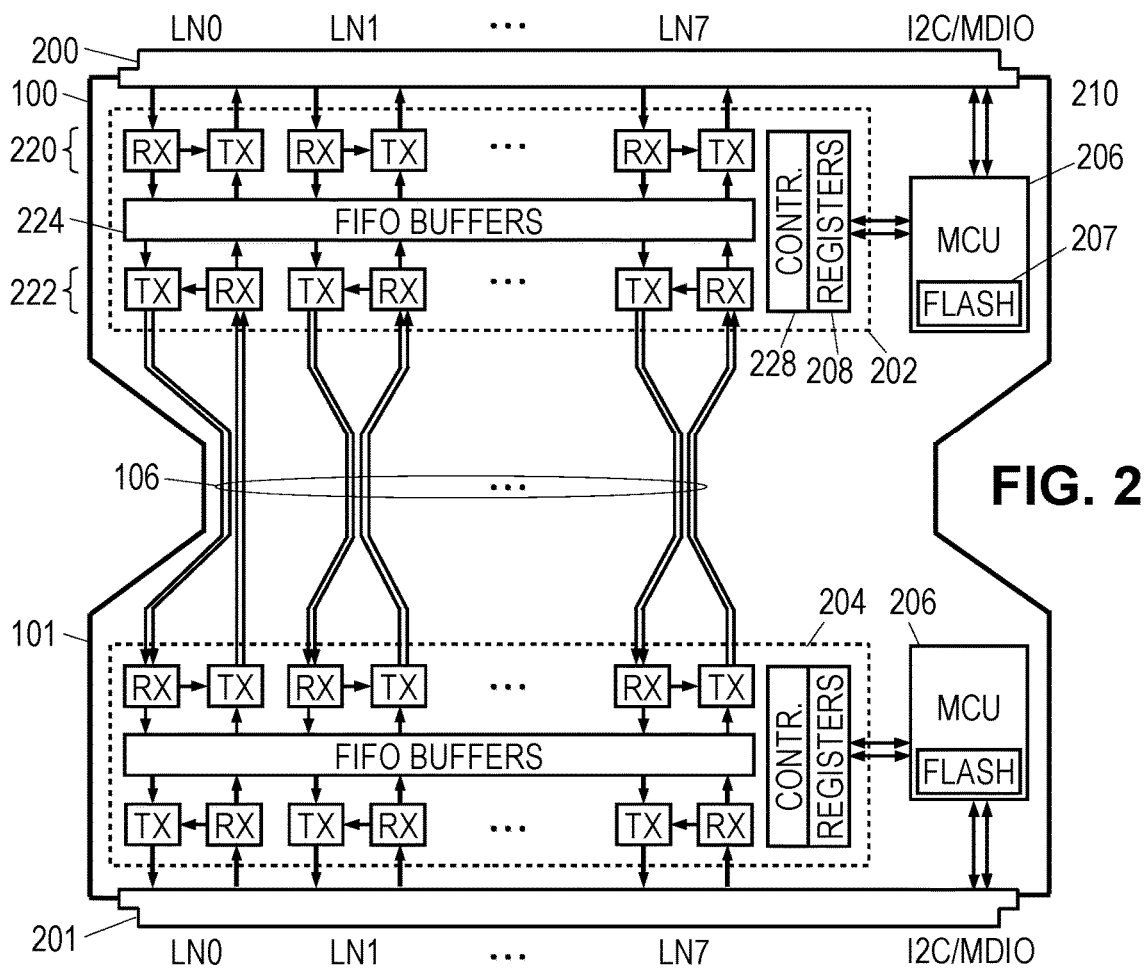
FIG. 2 is a function-block diagram of the illustrative AEC.

FIG. 2 is a function-block diagram of the illustrative cable of FIG. 1. Connector 100 includes a plug 200 adapted to fit a standard-compliant Ethernet port in a first host device to receive an electrical input signal carrying an outbound data stream from the host device and to provide an electrical output signal carrying an inbound data stream to the host device. Similarly, connector 101 includes a plug 201 that fits an Ethernet port of a second host device. Connector 100 includes a first DRR device 202 to perform CDR and re-modulation of the data streams entering and exiting the cable at connector 100, and connector 101 includes a second DRR device 204 to perform CDR and re-modulation of the data streams entering and exiting the cable at connector 101. The DRR devices 202, 204 may be integrated circuits mounted on a printed circuit board and connected to edge connector traces (for interfacing with the host devices) and to solder pads (for attachment to cable wires) via circuit board traces. The electrical conductors 106 and shields may be soldered to corresponding pads on the printed circuit board that electrically connect to the DRR devices.

In at least some contemplated embodiments, the printed circuit boards each also support a micro-controller unit (MCU) 206. Each DRR device 202, 204 is coupled to a respective MCU device 206 which configures the operation of the DRR device via a first two-wire bus. At power-on, the MCU device 206 loads equalization parameters from Flash memory 207 into the DRR device's configuration registers 208. The host device can access the MCU device 206 via a second two-wire bus that operates in accordance with the I2C bus protocol and/or the faster MDIO protocol. With this access to the MCU device 206, the host device can adjust the cable's operating parameters and monitor the cable's performance.

Each DRR device 202, 204, includes a set 220 of transmitters and receivers for communicating with the host device and a set 222 of transmitters and receivers for sending and receiving via conductor pairs running the length of the cable. The illustrated cable supports eight bidirectional communication lanes LN0-LN7, each bidirectional lane formed by pairs of unidirectional connections. The unidirectional connections may be provided with single-ended signaling or differential pair signaling, and the DRR devices may convert between the two. In some embodiments, the DRR devices further convert between PAM4 and NRZ signaling. The transceivers optionally include a memory 224 to provide first-in first-out (FIFO) buffering between the transmitter & receiver sets 220, 222. An embedded controller 228 coordinates the operation of the transmitters and receivers by, e.g., setting initial equalization parameters and ensuring the training phase is complete across all lanes and links before enabling the transmitters and receiver to enter the data transfer phase. The embedded controller 228 employs a set of registers 208 to receive commands and parameter values, and to provide responses potentially including status information and performance data.

Figure 3:
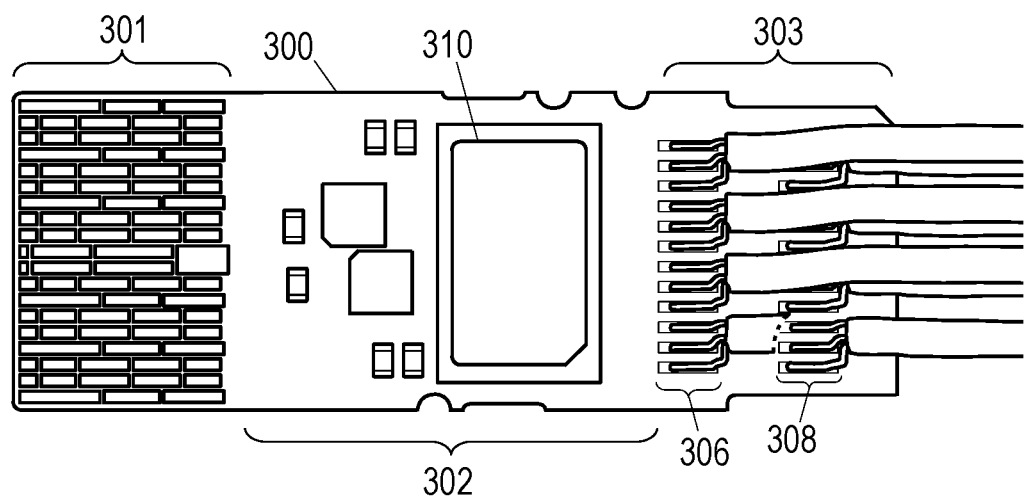
FIG. 3 is a top view of a first paddle card embodiment having an undesirable connection geometry.

FIG. 3 is a top view of a first embodiment of a paddle card 300. The paddle card 300 is a printed circuit board having an edge connection portion 301 and a wiring attachment portion 303 coupled together by an intermediate portion 302 having optional electronic components (such as an integrated circuit DRR device 310) for receiving and redriving signals in each direction while optionally providing protocol and signal format conversion.

Edge connection portion 301 has printed circuit traces along the left edge of the card, which are exposed for electrically contacting conductors when the left edge is seated within an edge connector socket. Typically, the exposed surface of the traces is plated with a hard alloy of copper or gold to resist wear and corrosion, enabling the traces to provide reliable coupling with the corresponding electrical conductors in the socket connector. The edge connector traces often have a gold coloration, sometimes causing the edge connection portion to be called "the golden finger".

As with conventional printed circuit boards, intermediate portion 302 includes solder pads for attaching leads or ball grid arrays of integrated circuits (such as DRR device 310) and other supporting electronic components to patterned traces on the board. The printed circuit board may have multiple layers with connections between traces of different layers being provided by conductive vias. Software is available for automatically placing components and routing traces to connect them together and to the edge connector traces and the wiring connection electrodes.

Wiring connection portion 303 has an arrangement of electrodes for permanent attachment to the electrical conductors in the body of the cable. As shown the electrical conductors are packaged as twinaxial wires each having a pair of sheathed conductors wrapped by a conductive shield (often accompanied by a shield conductor to reduce the shield impedance) and an outer sheath. When the end of a given twinaxial wire is stripped to expose the ends of the sheathed conductors, the exposed end of each conductor (including the shield conductor) is aligned with a corresponding electrode and soldered into place.

The electrodes are shown arranged parallel to the right edge of the paddle card 300 in two columns forming an inner set of electrodes 306 and an outer set of electrodes 308. (The terms "inner" and "outer" are used solely to indicate the electrode position relative to the edge of the paddle card. The terms are also used when referencing wires that are attached to the inner or outer electrodes, indicating their attachment point without any other import as to the wire position except as expressly described herein.) One of the inner wires is cropped to make visible the attachment configuration of one of the outer wires.

Figure 4:
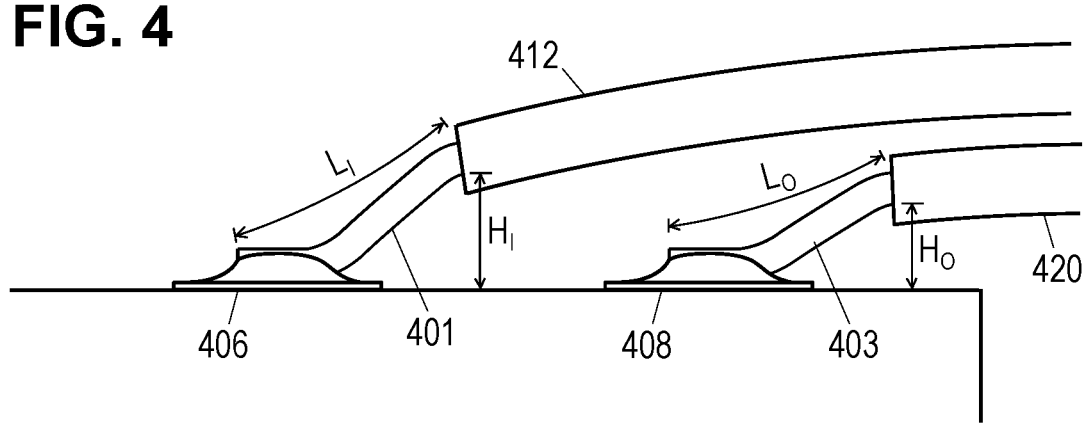
FIG. 4 is a close-up side view showing dimension parameters of the first embodiment.

FIG. 4 shows a close-up of an exposed end 401 of inner wire 412 attached to electrode 406 with solder or another form of conductive adhesive, and the exposed end 403 of outer conductor 420 similarly attached to electrode 408. Though the connection geometry can be complex, two geometric parameters that influence the connection impedance are the exposed end length L (as measured before bending) and the "loop height" H (the height at which the exposed end exits the sheath above the PCB surface). Thus FIG. 4 shows $L_i$ and $H_i$, the geometric parameters for the inner wire connections and $L_o$ and $H_o$, the geometric parameters for the outer wire connections.

Note in FIG. 3 that the inner and outer sets of electrodes are aligned with each other, forcing the inner wires to pass over the outer wires as shown in FIG. 4. Given the connector space constraints and other considerations (such as ease of manufacture and uniformity of wire length), this arrangement increases the loop height for the inner wire connections and may necessitate increase length of the exposed end. Even the outer wire connections have a nonzero loop height (due to the sheath thickness) and may have a longer than necessary exposed end length. These factors cause the wire connections to have an undesirable impedance discontinuity, causing signal attenuation (and potentially producing signal echoes) in the receive signal.

Figure 5:
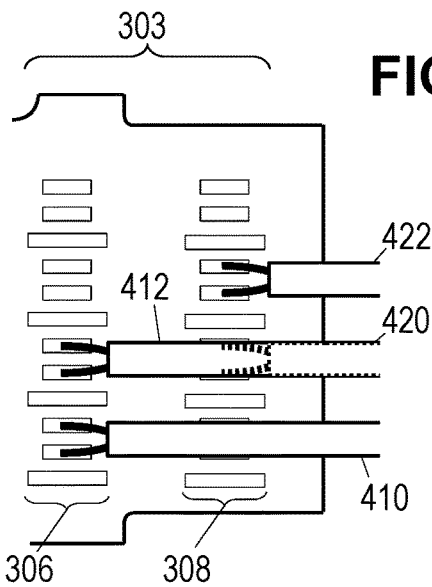
FIG. 5 is a top view of the first embodiment's wire connection portion.

FIG. 5 is a top view of the first embodiment's wire connection portion 303, showing aligned sets of inner electrodes 306 and outer electrodes 308. Two inner wires 410, 412 are shown with the signal conductors attached to corresponding inner electrodes, and two outer wires 420, 422 are shown with signal conductors attached to corresponding outer electrodes. (For clarity, the shield conductors are omitted.)

Figure 6:
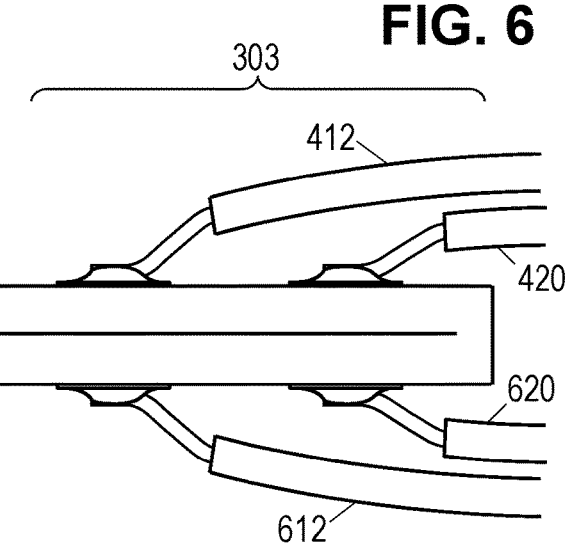
FIG. 6 is a cross-section of the first embodiment's wire connection portion.

FIG. 6 is a cross-section of the first embodiment's wire connection portion 303, showing inner wire 412 and outer wire 420 attached to the electrodes on the top surface. Optionally, the wire connection portion provides electrodes on the bottom surface for attachment to another set of inner and outer wires, including inner wire 612 and outer wire 620. The paddle card preferably includes a ground plane 600 that extends between attachment electrodes on opposite surfaces of the wire connection portion 303.

In contrast with the wiring connection portions shown and described previously, FIGS. 7-9 show a wiring connection portion 703 that provides a paddle card with an enhanced connection geometry to reduce the loop heights and enable reduction of the exposed end lengths.

Figure 7:
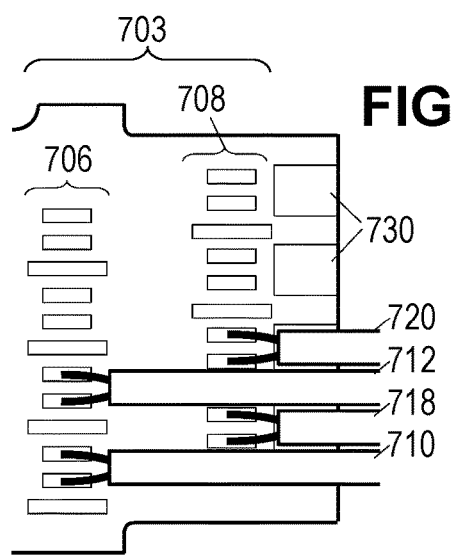
FIG. 7 is a top view of a wire connection portion with enhanced connection geometry.

FIG. 7 is a top view of a wire connection portion 703 having an inner set of electrodes 706 and an outer set of electrodes 708 that are staggered relative to each other. The outer wires 718, 720 are spaced far enough apart that with the staggered positioning, the inner wires 710, 712 are able to pass between the outer wires and remain parallel to the PCB surface, rather than being forced to pass over the outer wires. Also shown are optional recesses 730 to accommodate the sheathes of the outer conductors.

Figure 8:
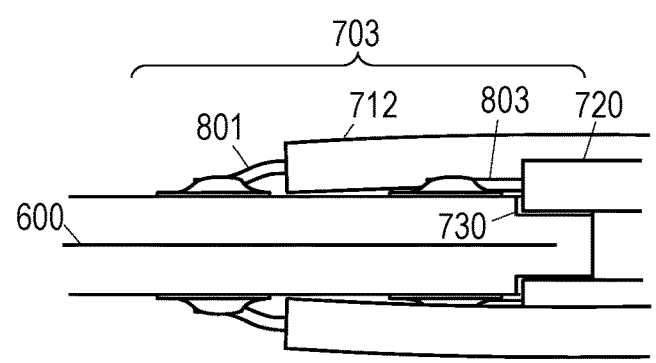
FIG. 8 is a cross-section of the wire connection portion with enhanced connection geometry.

FIG. 8 is a cross-section of the wire connection portion 703, showing an inner wire 712 with its exposed end 801 attached to an inner electrode and an outer wire 720 with its exposed end 803 attached to an outer electrode. Notably, inner wire 712 passes behind outer wire 730 rather than over as shown in FIG. 6. Ideally, the inner wire maintains contact with the PCB surface, though some small separation may be needed to accommodate the connection of the outer wire ground conductors (see FIG. 3). FIG. 8 also shows optional attachments for the bottom surface of the wire connection portion.

Wire connection portion 303 has an optional surface recess 730 that extends along the path of the outer wire from the edge of the paddle card toward the outer electrode to accommodate the outer wire's sheath, enabling exposed end 803 to be attached to the outer electrode while remaining parallel to the upper surface of the wire connection portion 303. While the surface recess 730 preferably has a depth at least equal to the sheath thickness, even reduced depths will reduce the loop height H relative to the geometry of FIG. 6. In some contemplated embodiments, the wiring sheath thickness may be such that the recess depth achievable with the given PCB manufacturing process cannot fully accommodate the sheath thickness. Even where such accommodation is possible, there may be other considerations (e.g., derivative of the impedance, or total reflection energy) that call for partial accommodation of the sheath thickness. Accordingly the preferred recess depth may be determined and optimized through simulation and experiment.

Figure 9:
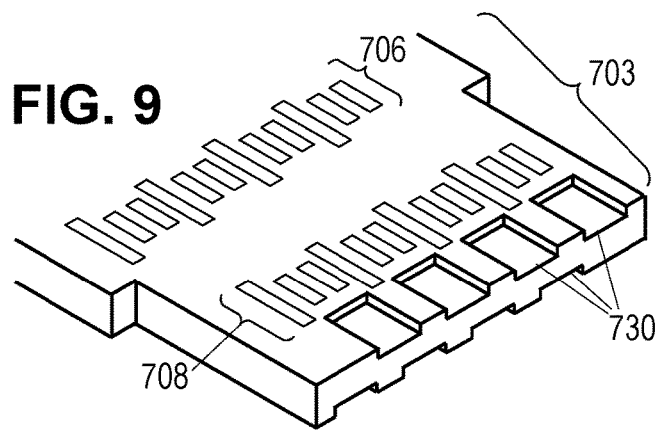
FIG. 9 is an isometric view of the wire connection portion with enhanced connection geometry.
Figure 10:
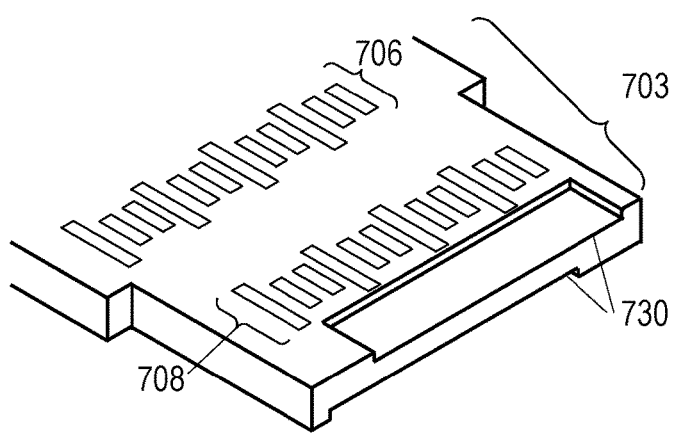
FIG. 10 is an isometric view of the wire connection portion with broad recesses.

FIG. 9 is an isometric view of wire connection portion 703 showing a recess 730 for each outer wire. The recesses 730 are shown as rectangular, but cylindrical concavities or other shapes suitable for accommodating the outer wire sheathes are also contemplated. In some embodiments, the recesses 730 are broadened as shown in FIG. 10 so that each recess can accommodate sheathes from multiple outer wires. If desired, the recess may extend across the full width of the paddle card to provide a stepped profile next to the outer set of electrodes.

Figure 11:
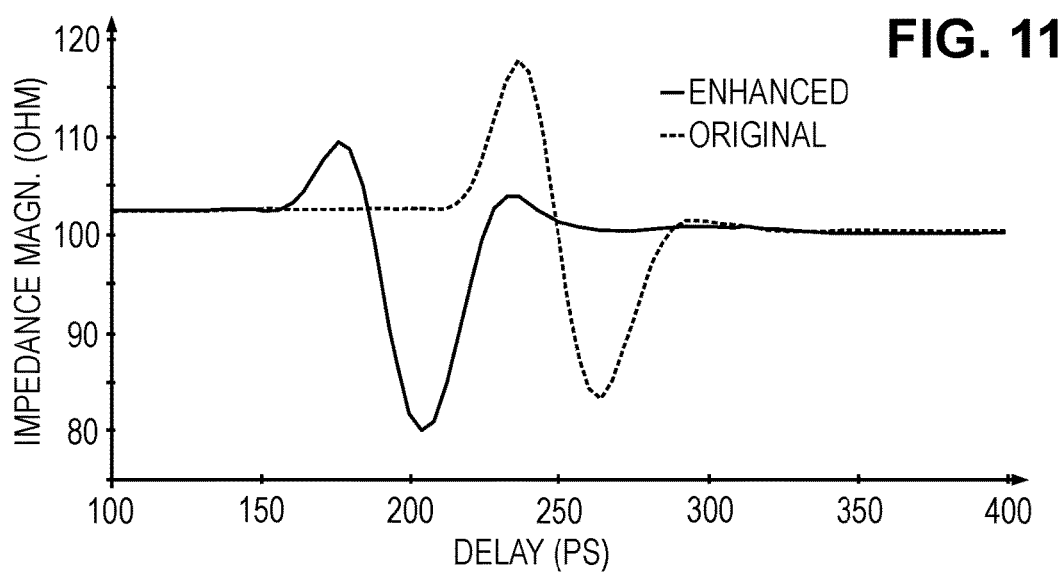
FIG. 11 is a graph of impedance vs distance (delay) from the integrated circuit.

FIG. 11 is a graph of impedance magnitude vs distance (in terms of propagation delay) as measured from the cable side of an outer wire. The impedance starts off constant, but increases where the signal exits the sheath and propagates along the exposed end of the wire to the solder connection. The impedance then dips where the signal traverses the solder connection, exhibits a smaller peak where the signal traverses a via, and returns to a constant value where the signal propagates along a printed circuit trace. In the original geometry (e.g., FIG. 6), the impedance rises from 102 to 118 ohms (16 ohm peak), whereas in the enhanced geometry the impedance rises only to just under 110 ohms (<8 ohm peak), a 50% reduction in the size of the peak. The peak width also shrinks from about 35 ps to about 28 ps, a 20% reduction.

Thus, to manufacture cables having an improved performance, a manufacturing system may obtain first and second printed circuit boards each having: edge connector traces arranged along a first edge for contacting electrical conductors when the printed circuit board is inserted in a matching socket; an outer set of electrodes arranged parallel to a second edge for attaching unsheathed ends of certain sheathed wires in a cable; and an inner set of electrodes arranged parallel to the second edge for attaching unsheathed ends of other sheathed wires in the cable, with the electrodes in the inner set being staggered relative to the electrodes in the outer set. The system unsheathes the ends of the cable wires and solders the exposed ends to the electrodes in the inner and outer set, before packaging the first and second printed circuit boards into connectors adapted to fit standard-compliant socket. At an earlier stage of the process, the system may equip the first and second printed circuit boards with an integrated circuit that recovers and remodulates signals passing between the edge connector traces and the electrodes of the inner and outer sets.

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:
1. A printed circuit board that comprises at least one surface having:
edge connector traces arranged along a first edge for contacting electrical conductors in a socket connector;

an outer set of electrodes arranged parallel to a second edge for attaching exposed ends of sheathed wires in a cable ("outer wires"); and an inner set of electrodes arranged parallel to the second edge for attaching exposed ends of sheathed wires in a cable ("inner wires"), with the electrodes in the inner set being staggered relative to the electrodes in the outer set.

2. The printed circuit board of claim 1, with the electrodes in each of the inner and outer sets being spaced to enable the inner wires to pass between the outer wires while maintaining contact with the at least one surface.

3. The printed circuit board of claim 1, further comprising an integrated circuit that recovers and remodulates signals passing between the edge connector traces and the electrodes of the inner and outer sets.

4. The printed circuit board of claim 1, wherein the outer wires each have a sheath with a given thickness adjacent to the exposed end, and wherein the printed circuit board further comprises one or more recesses in the at least one surface along each outer wire sheath's path between the second edge and the outer set of electrodes.

5. The printed circuit board of claim 4, wherein the one or more recesses each accommodates sheathes of multiple outer wires.

6. The printed circuit board of claim 4, wherein each outer wire has a corresponding one of the one or more recesses.

7. The printed circuit board of claim 4, wherein each of the one or more recesses is deep enough to accommodate the given thickness of the sheath, enabling each of the exposed ends of the outer wires to contact the electrodes in the outer set while remaining parallel to the at least one surface.

8. The printed circuit board of claim 7, further comprising a second surface having:
a second outer set of electrodes arranged parallel to the second edge for attaching exposed ends of sheathed outer wires; and
one or more recesses in the second surface extending along a path of each sheathed outer wire's sheath between the second edge and the second outer set of electrodes.

9. A cable that comprises:
sheathed wires extending between a first connector and a second connector,
each of the first and second connectors including a printed circuit board with at least one surface having:
edge connector traces arranged along a first edge for contacting electrical conductors when the connector is inserted in a socket;
an outer set of electrodes arranged parallel to a second edge for attaching unsheathed ends of some of the sheathed wires; and
an inner set of electrodes arranged parallel to the second edge for attaching unsheathed ends of others of the sheathed wires,
with the electrodes in the inner set being staggered relative to the electrodes in the outer set.

10. The cable of claim 9, wherein the electrodes in each of the inner and outer sets are spaced to enable the sheathed wires attached to the inner set to maintain contact with the at least one surface while passing between the sheathed wires attached to the outer set.

11. The cable of claim 9, further comprising an integrated circuit that recovers and remodulates signals passing between the edge connector traces and the electrodes of the inner and outer sets.

12. The cable of claim 9, wherein each printed circuit board further comprises one or more recesses in the at least one surface between the second edge and the outer set of electrodes to accommodate sheathes of the sheathed wires attached to the outer set of electrodes.

13. The cable of claim 12, wherein the one or more recesses each accommodates sheathes of multiple sheathed wires.

14. The cable of claim 12, wherein each sheathed wire attached to the outer set of electrodes has a corresponding one of the one or more recesses.

15. The cable of claim 12, wherein each of the one or more recesses is deep enough to accommodate a full thickness of the sheath near the unsheathed end, enabling each of the unsheathed ends of the wires attached to the outer set of electrodes to contact those electrodes while remaining parallel to the at least one surface.

16. A cable manufacturing method that comprises:
providing first and second printed circuit boards each having:
edge connector traces arranged along a first edge for contacting electrical conductors when the printed circuit board is inserted in a matching socket;
an outer set of electrodes arranged parallel to a second edge for attaching unsheathed ends of certain sheathed wires in a cable; and
an inner set of electrodes arranged parallel to the second edge for attaching unsheathed ends of other sheathed wires in the cable, with the electrodes in the inner set being staggered relative to the electrodes in the outer set;
soldering unsheathed ends of the sheathed wires to the electrodes in the inner and outer set; and
packaging the first and second printed circuit boards into connectors adapted to fit into a socket.

17. The method of claim 16, further comprising equipping each of the first and second printed circuit boards with an integrated circuit that recovers and remodulates signals passing between the edge connector traces and the electrodes of the inner and outer sets.

18. The method of claim 16, wherein the electrodes in each of the inner and outer sets are spaced to enable the sheathed wires attached to the inner set to maintain contact with the at least one surface while passing between the sheathed wires attached to the outer set.

19. The method of claim 18, wherein each printed circuit board further comprises one or more recesses in the at least one surface between the second edge and the outer set of electrodes to accommodate sheathes of the sheathed wires attached to the outer set of electrodes, each of the recesses being deep enough to accommodate a full thickness of the sheath near the unsheathed end.

20. The method of claim 19, wherein each sheathed wire attached to the outer set of electrodes has a corresponding one of the one or more recesses.

* * * * *